United States Patent [19]

Schumacher

[11] Patent Number: 4,595,222

[45] Date of Patent: Jun. 17, 1986

[54] CARRIER HANDLE

[75] Inventor: David D. Schumacher, Plymouth, Minn.

[73] Assignee: FSI Corporation, Chaska, Minn.

[21] Appl. No.: 655,253

[22] Filed: Sep. 28, 1984

[51] Int. Cl.⁴ .................................................. B65G 7/12
[52] U.S. Cl. ..................................... 294/16; 294/34; 294/103.1
[58] Field of Search .................. 294/15, 16, 34, 62, 294/87.26, 104, 106, 137, 145, 161, 163, 164, 166, 168, 87.1, 103.1

[56] References Cited

U.S. PATENT DOCUMENTS

| | | | |
|---|---|---|---|
| 2,694,595 | 11/1954 | Garris | 294/16 |
| 2,936,192 | 5/1960 | Lince | 294/16 |
| 3,104,462 | 9/1963 | Bode | 294/104 X |
| 3,261,634 | 7/1966 | Hewson | 294/16 |
| 3,400,843 | 9/1968 | Johnson | 294/16 X |
| 3,861,733 | 1/1975 | Mey | 294/16 X |

FOREIGN PATENT DOCUMENTS

| | | | |
|---|---|---|---|
| 134767 | 9/1933 | Austria | 294/62 |
| 70483 | 1/1950 | Denmark | 294/62 |
| 1106704 | 12/1955 | France | 294/62 |
| 313923 | 7/1956 | Switzerland | 294/62 |

OTHER PUBLICATIONS

IBM Technical Disclosure Bulletin, vol. 17, No. 6, Nov., 1974, "Pickup Tool", by K. Schoenfeld.

Primary Examiner—Johnny D. Cherry
Attorney, Agent, or Firm—Palmatier & Sjoquist

[57] ABSTRACT

A handle attachable to the end panel of a wafer carrier having a pair of opposing clamp jaws interconnected by an elongate articulated frame which includes a mechanism for producing movement of the jaws toward or away from each other, a grip bar for grasping the handle and retaining rods for traversing the open side of the carrier and to retain wafers within the carrier.

2 Claims, 7 Drawing Figures

CARRIER HANDLE

BACKGROUND OF THE INVENTION

The present invention relates to a handle that is attachable to wafer carriers or baskets that are designed for carrying and storing substrates, such as silicon wafers.

Wafers are processed by the semiconductor industry in the manufacture of electronic devices such as integrated circuit chips. The carriers typically have end panels for reinforcement, slotted side walls for confining the wafers and allowing processing fluids to obtain access to the wafers, and inner support surfaces and ribs for supporting and spacing the wafers.

The processing of wafers requires that they be successively immersed or sprayed with liquids and gases, and drained free of such liquids. Machines used in this process commonly have a turntable for mounting a carrier with wafers for processing. Other types of machinery may be used employing conveyors and/or racks.

In the past, wafer carriers have been handled manually for loading onto the turntable and similarly removed by the same method. This method of handling the carriers may introduce contaminates and particulates into the processing machines that may affect the cleanliness of the wafers being processed. Particulate and other contamination of the wafers must be avoided in order to manufacture an integrated circuit chip operable within the range of standards set by the industry.

Wafers that are presently being manufactured have diameters as large as eight inches. Typically twenty-five of such wafers are within a single carrier which requires that the carrier be large enough for this capacity. Such a carrier which is full of wafers will weigh 8 to 9 pounds. Ten inch wafers are now starting to be used and will be in common use in the foreseeable future. Hence, the manual gripping of the carriers required to load and unload them into machinery is awkward, difficult and nearly impossible to be performed by a person with small hands. This is particularly so for women who are employed in great numbers in the manufacturing process of silicon wafers.

During loading into and unloading carriers from a turntable, the carrier is oriented with its ends at top and bottom, and the opening is at the side. Care must be taken to prevent wafers from sliding out of the carrier to prevent damage to and breakage of the wafers.

SUMMARY OF THE INVENTION

In the present invention, first and second clamp jaws oppose one another to grasp the end panel of the carrier. An elongate articulated frame interconnects the jaws. The frame has a grip bar and an operating lever mechanism for producing relative movement of the jaws toward or away from each other. The mechanism lever is connected to the movable jaw and a spring biases the movement of the jaws into an open position. Two retaining rods parallel to and spaced from each other are connected to the frame adjacent the stationary jaw and extend transversely from the first jaw.

The opposing clamp jaws are for engaging and confronting opposite edges of a carrier end panel. The grip bar provides a location for manually gripping the carrier handle. The operating lever actuates the relative movement of the jaws toward each other against the biasing spring. The retaining rods traverse the open side of the carrier to retain the wafers and urge them into a properly seated position therein when the carrier is stood on end or picked up from the same position.

To operate the handle, the grip bar is manually grasped and the rods are positioned adjacent the edges of the wafers at the open side of the wafer carrier. The movable jaw is then brought into engagement with the bottom edge of the carrier end panel. The stationary jaw and the rods are then tilted downwardly so that the stationary jaw confronts the panel and the rods engage the edges of any wafers which are not properly seated in the carrier and move the wafers into such properly seated position. The operating lever is then moved to move the movable jaw and produce relative convergent movement of the jaws into the gripping relation to the top and bottom edges of the panel and to simultaneously complete movement of the rods as to complete the seating of all of the wafers in the carrier.

The present invention advantageously provides an attachable wafer carrier handle of simple construction that is easy to grip and operate. The handle is applicable to a carrier either when it is sitting on its bottom or when it is standing on its end. Use of the handle minimizes the chances of introducing particulate and other contaminates onto the wafers or into the close quarters of a processing machine where the carrier may be located. The handle additionally urges and retains the wafers in their properly seated position within the carrier thereby preventing their falling out and damage if the carrier is tipped.

DETAILED SPECIFICATION

Figure 1:
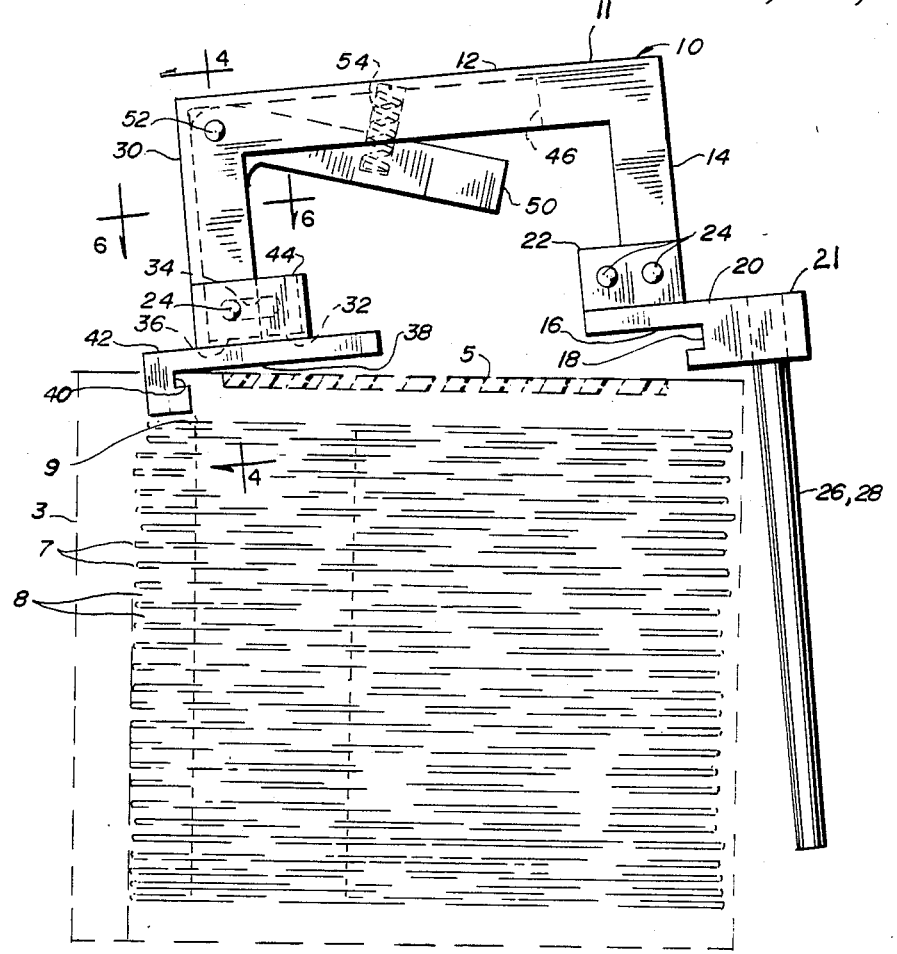
FIG. 1 is a side elevation of the carrier handle over a cross sectional view of a wafer carrier in dotted outline.
Figure 3:
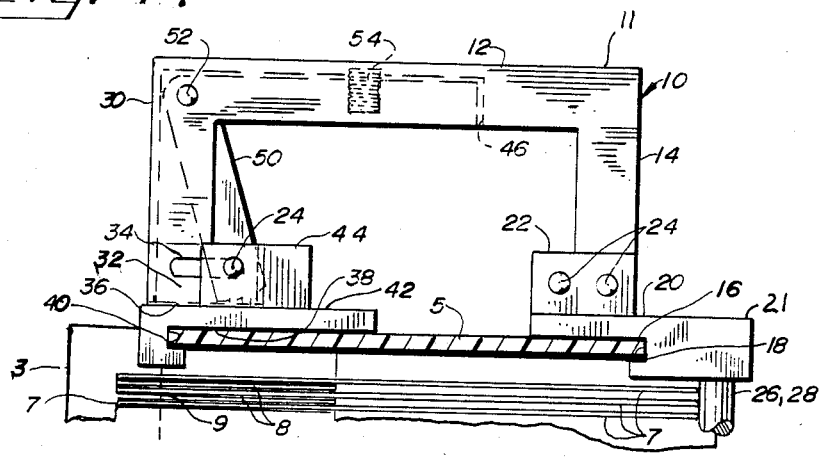
FIG. 3 is a side elevation of the carrier handle attached the end panel of the wafer carrier partially broken away.
Figure 2:
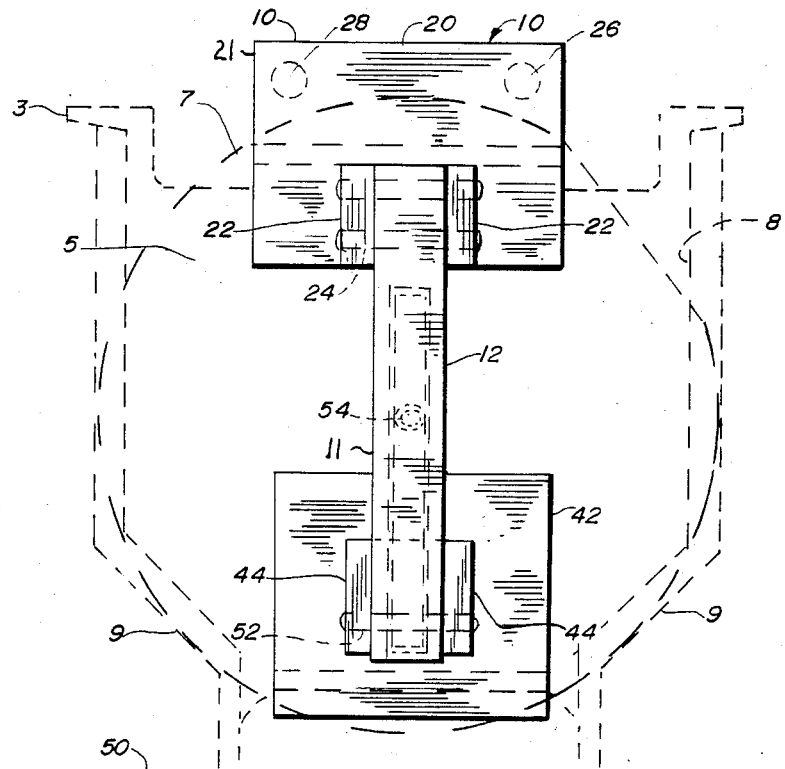
FIG. 2 is a front elevation of the carrier handle attached to a end panel of the wafer carrier.

Referring to FIGS. 1, 2 and 3, wafers 7 are carried by carrier 3. Wafer carrier 3 has an end panel 5. Ribs 8 space and support wafers 7. Wafer seat 9 is also a surface of support that touches the wafers 7 when they are in a proper seating arrangement within the carrier 3.

The carrier handle, generally indicated by numeral 10, is preferably molded of PFA Teflon (perfluoroalkoxy) or FEP Teflon (fluoroethylene polymer) which are manufactured by E. I. DuPont DeNemours & Company of Wilmington, Del. Such plastics are inert and highly resistant to the corrosive effects of active chemicals.

Handle 10 has an elongate frame 11 which includes a grip bar 12 that integrally interconnects first and second legs 14 and 30 which are connected to opposing first and second clamp jaws 16 and 38 respectively so the jaws 16 and 38 extend transversely below frame 11. First jaw 16 with panel recess 18 is preferably elongate and has mounting plate 20 similarly extending transversely below frame 11. On the other side of mounting plate 20 from jaw 16 are opposing ears 22. The end of first leg 14 fits between ears 22 and is securely fastened there suitably by steel pins 24 passing therethrough. Mounting plate 20 has a thick portion 21, adjacent first jaw 16, which serves as an extension of the frame 11, for securely mounting retaining rods 26 and 28 which have a pressed fit relation in mounting holes therein. Retaining rods 26 and 28 are preferably of polyvinylidenefluoride (PVDF) and are fitted into mounting plate 20 so that they are parallel to and spaced from each other and extend traversely from first jaw 16.

Figure 4:
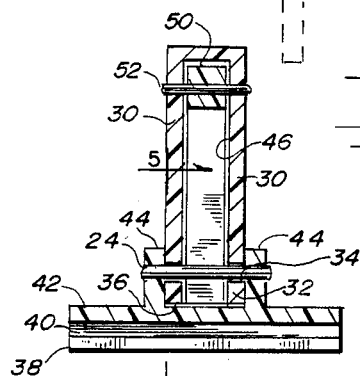
FIG. 4 is a detailed section at 4—4 of FIG. 1.
Figure 5:
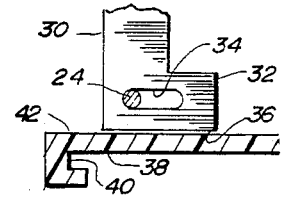
FIG. 5 is a detailed section at 5—5 of FIG. 4 partially broken away.

As more clearly shown in FIGS. 4 and 5, second leg 30 has an elongate guide foot 32 at its end. Foot 32 has an elongate guide slot 34 and an elongate smooth bottom 36. Second jaw 38 with panel recess 40 is preferably elongate and has mounting plate 42 also extending transversely below frame 11. On the other side of mounting plate 42 from jaw 38 are opposing ears 44. Foot 32 fits between ears 44 with its bottom 36 lying adjacent the surface of mounting plate 42. Second jaw 38 and mounting plate 42 are slidably connected to guide foot 32 suitably by a steel pin 24 passing through guide slot 34 and being anchored in ears 44.

Figure 6:
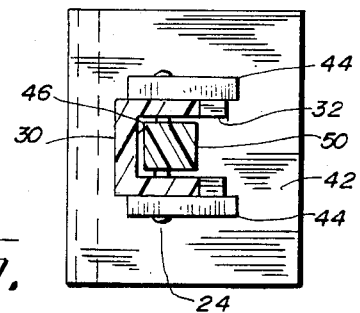
FIG. 6 is a detailed section at 6—6 of FIG. 1.

In FIGS. 1, 4 and 6 it may be seen that a portion of grip bar 12 and all of second leg 30 are hollow and have a cavity 46 therein. The portion of grip bar 12 and second leg 30 having cavity 46 are generally U-shaped in cross section. Operating lever 50, which preferably forms an acute angle between its ends, is disposed in cavity 46 and pivotally mounted on steel pin 52 near the juncture of grip bar 12 and second leg 30. Pin 24, which is anchored in ears 44 and passes through guide slot 34, also passes through lever 50 near its end which is adjacent mounting plate 42. The other end of lever 50 extends along grip bar 12 within finger reach. Spring 54 in grip bar 12 biases lever 50 so that the extending end depends or is exposed below grip bar 12 while second jaw 38 is disposed at its farther most or open position away from first jaw 16.

Opposing first and second clamp jaws 16 and 38 with panel recesses 18 and 40 are elongate to confront and engage a substantial portion of the opposing edges of end panels 5. Mounting plates 20 and 42 also confront and engage the outer face of the end panel 5. By this construction once the handle 10 has been attached to carrier 3, the carrier is immobilized or rigid with respect to the handle 10. That is, handle 10 is fixed to carrier 3 so that no wobbling or teetering of the carrier 3 occurs when moving carrier 3 about by handle 10. With this predetermined fixed relationship established, the handle 10 may be used to precisely manipulate the carrier 3 into or out of close quarters such as in a processing machine.

Grip bar 12 projects from jaws 16 and 38 to allow for easy grasping of the handle 10 single handedly regardless of the carrier's 3 orientation. More specifically, once handle 10 is attached to carrier 3, grip bar 12 extends from end panel 5 thereby providing for easy loading into and unloading the carrier 3 from a turntable within a processing machine.

Retaining rods 26 and 28 are securely fitted into the thick portion 21 of mounting plate 20 so that they are rigid with respect to the grip bar 12 and first jaw 16. As handle 10 is brought closer to carrier 3, rods 26 and 28 may be guided by grip bar 12 to traverse the open side of the carrier. Rods 26 and 28 are parallel and spaced so as to provide two smooth surfaces to near equally bear upon the flat edges of wafers 7. When rods 26 and 28 engage the wafers 7 to urge into or retain them in their properly seated position at wafer seat 9, they only touch the edges of the wafers 7. Sliding action along the wafer edge which may create particulates does not occur.

The elongate bottom 36 of guide foot 32 provides a surface for mounting plate 42 with second jaw 38 to slide therealong and maintain the proper opposing orientation of the second jaw 38 with respect to the first jaw 16. This orientation is further maintained by the combination of anchored pin 24 sliding in guide slot 34 as second jaw 38 is moved. This construction allows for a substantially linear relative movement between jaws 16 and 38.

Operating lever 50, which is biased by spring 54 and extends from cavity 46 in grip bar 12, may be simultaneously grasped with grip bar 12 by a single hand. Squeezing lever 50 into cavity 46 actuates the movement of the second jaw 38 towards the first jaw 16 into a closed position for attachment of the handle 10 to carrier 3.

In operation referring to FIGS. 1 and 3, the grip bar 12 and lever 50 are grasp by a hand. Opposing clamp jaws 16 and 38 may be applied to carrier 3 either when it is standing on its bottom, such as on a tray, conveyor or rack, or when carrier 3 is standing on its end, such as a turntable within a processing machine. As jaws 16 and 38 in their open position are brought toward end panel 5, retaining rods 26 and 28 are guided over the open side of the carrier not yet touching wafers 7. Second jaw 38 is then engaged with the bottom edge of end panel 5. As mounting plate 20 and first jaw 16 are swung into engagement with end panel 5 and its opposing edge, rods 26 and 28 touch and urge wafers into the carrier 3. When operating lever 50 is squeezed into cavity 46, second jaw 38 pulls grip bar 12 and first jaw 16 towards it thereby closing the jaws and securely attaching the handle 10 to carrier 3. Because rods 26 and 28 are rigid with respect to grip bar 12 and first jaw 16, this action further urges rods 26 and 28 to gently move wafers 7 into their proper seating arrangement. Once jaws 16 and 38 are completely closed and confronting the edges of panel 5, rods 26 and 28 retain wafers 7 which touch wafer seat 9 within carrier 3. At which time carrier 3 may be picked up and manipulated by handle 10. The operator's hand must continue to grip the grip bar 12 and lever 50 as carrier 3 is being manipulated. Removal of handle 10 from carrier 3 follows the reverse of the above action sequence.

Utilizing handle 10 with the mounting of carrier 3 onto a turntable follows the above attachment sequence. Subsequently, the carrier 3 is lowered and guided with its other end panel first by handle 10 onto the turntable within the close quarters of the processing machine. Handle 10 is then removed leaving the carrier on the turntable.

Removal of the carrier 3 is done by lowering handle 10 into the machine while rods 26 and 28 are guided along the open side of carrier 3. Second jaw 38 is engaged with the edge of end panel 5. As first jaw 16 is lowered onto panel 5, rods 26 and 28 touch and urge wafers 7 towards wafer seat 9. Lever 50 is then squeezed to close jaws 16 and 38 effectively attaching handle 10 to carrier 3 while retaining wafers 7 at their seat 9 with rods 26 and 28. Attached handle 10 and carrier 3 are then lifted out of the machine with wafers 7 retained by rods 26 and 28.

Figure 7:
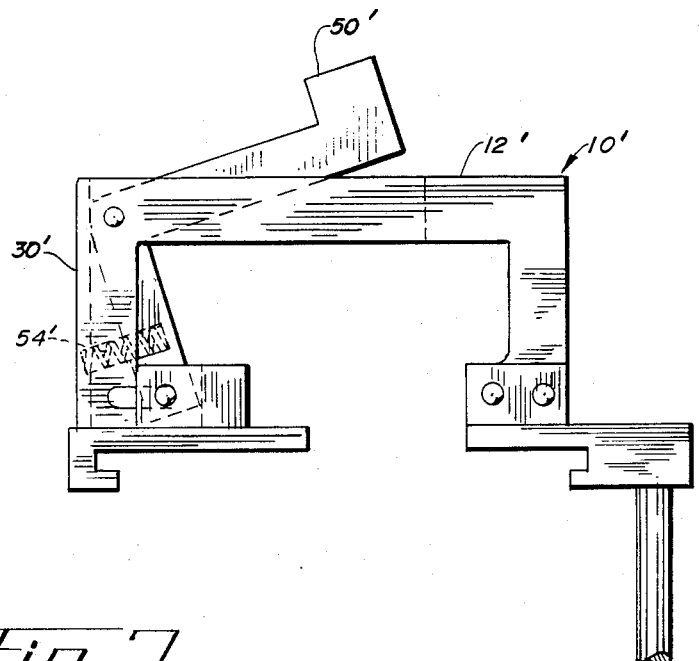
FIG. 7 is a side elevation of a modified form of the carrier handle.

Referring to FIG. 7, a modified handle 10' may have a substantially right angled operating lever 50' that is biased by spring 54' in second leg 30'. By this construction the clamp jaws are biased in a closed postion rather than an open position. Lever 50' extends above grip bar 12'. Upon squeezing lever 50' into grip bar 12', the clamp jaws are open for engagement with an end panel of a wafer carrier.

Another modified form may not have elongate clamp jaws with panel recesses and mounting plates. Other jaw constructions may be used that will hold the carrier by its opposing edges of the end panel and have frame portions that will extend transversely from the grip bar or frame to confront the end panel and maintain a predetermined orientation between the handle and the carrier.

The present invention may be embodied in other specific forms without departing from the spirit or essential attributes thereof. Therefore, the illustrated embodiments should be considered in all respects as illustrative and not restrictive, reference being made to the appended claims rather than to the foregoing description to indicate the scope of the invention.

I claim:

1. A device attachable to an end panel of a wafer carrier for manipulating the carrier and retaining wafers at the open side of the carrier, comprising first and second opposing clamp jaws for attaching to opposite edges of the carrier end panel, an elongate articulated frame having the first jaw mounted thereon and including a guiding foot with an elongate bottom, a mounting plate affixed to the second jaw and lying against the bottom of the guide foot for movement therealong and maintaining the orientation of the second jaw with respect to the first jaw, an operating means on the frame connected with the mounting plate for moving the plate and second jaw along the guide foot toward and away from the first jaw, and a retaining rod connected to the frame adjacent the first jaw and extending transversely from the first jaw to traverse the open side of the carrier and retain the wafers therein.

2. A device attachable to an end panel of a wafer carrier for manipulating the carrier and retaining wafers at the open side of the carrier, comprising elongate first and second opposing clamp jaws each having a panel receiving recess for confronting and engaging opposite edges of the carrier end panel and a mounting plate for confronting and engaging the panel to maintain a predetermined orientation between the jaws and the carrier, an articulated elongate frame interconnecting the jaws, the first jaw being rigid with respect to the frame, the frame having a grip bar adapted to be manually gripped, a guide foot with an elongate bottom for movement of the mounting plate of the second jaw therealong and maintaining the orientation of the second jaw with respect to the first jaw, and a mechanism for producing substantially linear movement of the second jaw toward and away from the first jaw along the bottom of the guide foot including a spring for biasing the second jaw away from the first jaw into a open position and an operating lever connected with the mounting plate of the second jaw operable for producing the movement of the second jaw toward the first jaw into a closed position, the lever extending along the grip bar to be simultaneously gripped by a person's hand, the grip bar having a hollow portion U-shaped in cross section for receiving and recessing the operating lever, and a pair of retaining rods of inert plastic highly resistant to corrosive effects of active chemicals parallel to and spaced from each other attached to the mounting plate of the first jaw, the rods being rigid with respect to the grip bar and extending transversely from the first jaw to traverse the open side of the carrier and retain the wafers therein.

* * * * *

UNITED STATES PATENT AND TRADEMARK OFFICE
Certificate

Patent No. 4,595,222                                             Patented June 17, 1986

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is David D. Schumacher, and Dallas J. Schneider.

Signed and Sealed this 3rd Day of February, 1987.

BRADLEY R. GARRIS,
*Office of the Deputy Assistant Commissioner for Patents.*